United States Patent [19]
Lee et al.

[11] Patent Number: 6,067,249
[45] Date of Patent: May 23, 2000

[54] LAYOUT OF FLASH MEMORY AND FORMATION METHOD OF THE SAME

[75] Inventors: Hee-Youl Lee; Jae-Hyun Sone, both of Yicheon, Rep. of Korea

[73] Assignee: Hyundai Electronics Industries Co., Ltd., Yicheon, Rep. of Korea

[21] Appl. No.: 09/220,594

[22] Filed: Dec. 28, 1998

[30]  Foreign Application Priority Data

Jun. 16, 1998 [KR]  Rep. of Korea ..................... 98-22624

[51] Int. Cl.$^7$ .................................................. G11C 16/04
[52] U.S. Cl. ................................ 365/185.05; 365/185.33
[58] Field of Search ........................ 365/185.05, 185.07, 365/185.26, 185.33; 257/315, 317, 319

[56]  References Cited

U.S. PATENT DOCUMENTS

| | | | |
|---|---|---|---|
| 5,255,243 | 10/1993 | Kitazawa | 365/233 |
| 5,315,541 | 5/1994 | Harari et al. | 365/63 |
| 5,343,063 | 8/1994 | Yuan et al. | 257/317 |
| 5,380,672 | 1/1995 | Yuan et al. | 437/43 |
| 5,467,305 | 11/1995 | Bertin et al. | 365/185.01 |
| 5,512,505 | 4/1996 | Yuan et al. | 437/43 |
| 5,610,420 | 3/1997 | Kuroda et al. | 29/788 |
| 5,748,538 | 5/1998 | Lee et al. | 365/185.06 |
| 5,751,038 | 5/1998 | Mukherjee | 257/316 |
| 5,912,840 | 6/1999 | Gonzalez et al. | 365/185.05 |
| 5,977,584 | 11/1999 | Kim | 257/315 |

*Primary Examiner*—David Nelms
*Assistant Examiner*—Anh Phung
*Attorney, Agent, or Firm*—Oliff & Berridge, PLC

[57]  ABSTRACT

A layout of a flash memory and a formation method of the same are disclosed. The layout includes a plurality of memory cells each having a cell transistor having a cell gate electrode having a floating gate and a control gate, and a source/drain electrode for thereby storing and erasing a data, a selection transistor having two gate electrodes, a common drain electrode between the gate electrodes and a source electrode formed outside the same and having a predetermined channel width larger than two times compared to the channel width of the cell transistor, and the drain electrode and source electrodes which are crossingly formed to each other with respect to the axis of the word lines through which a driving voltage is applied to the gate electrodes for thereby selecting a corresponding memory cell, a pair of cell bit lines connected with the source electrode of the selection transistor and connected in parallel with the drain electrode of the memory cell transistor for inputting/outputting the data to the cell transistor, and a pair of array bit lines connected with a drain electrode of the selection transistor and a peripheral circuit.

10 Claims, 5 Drawing Sheets

LAYOUT OF FLASH MEMORY AND FORMATION METHOD OF THE SAME

BACKGROUND OF THE INVENTION

1. Field of the Invention

The present invention relates to a non-volatile memory, and in particular to a layout of a flash memory and a formation method of the same which are capable of significantly enhancing a reliability of a semiconductor apparatus by increasing a current driving capacity of a selection transistor for selecting a memory cell of a flash memory.

2. Description of the Conventional Art

Generally, in the non-volatile memory, the data stored in a cell are not erased even when a drive power is not supplied to the same. Among the non-volatile memories, the EEPROM(Electrically Erasable Programmable Read Only Memory) has a function capable of erasing the data stored in the cell at one time or by the unit of the sectors, so that it is widely used for a computer and a memory card.

This flash memory is classified into a NAND type and a NOR type in accordance with a connection state of a cell and bit line. Of which, the NOR type flash memory is formed of more than two cell transistors which are connected with one bit line in parallel, and the NAND type flash memory is formed of more than two cell transistor connected in series with one bit line.

In the large capacity flash memory, since there are many memory cells sharing a bit and word line, the stress applied to the cell which is not selected is increased. In addition, the capacitance and resistance of each bit and word line is increased, so that the structure of the cell array is generally changed as follows.

Namely, the memory cells of the large capacity flash memory are divided into a plurality of blocks for thereby decreasing the number of the shared word lines and bit lines. In this case, the memory has the advantages in that the cell characteristic is enhanced as the stress applied to the cells of the entire memories is decreased, and the operation speed of the memory is increased as the connection line between the devices is shortened.

In this case, since a peripheral circuit such as a decoder, etc. is additionally used for each divided cell block, the flash memory is connected in such a manner that the bit line is separately connected for each cell connection portion and peripheral system connection portion.

For example, one bit line is commonly used as a plurality of cell bits connecting each drain in parallel in more than two memory cells, and one array bit line connecting a memory cell to a peripheral circuit such as a bit line decoder, a page buffer, etc.

At this time, the cell bit line and array bit line are connected based on a selection transistor for driving a corresponding cell transistor among the memory cell arrays. In more detail, the array bit line is connected with a drain of the selection transistor, and the cell bit line is connected with a source of the selection transistor.

In the NOR type flash memory using the divided bit lines, when selecting a predetermined memory cell, the array bit line and memory cell are connected in a state that the selection transistor connected with a corresponding cell bit line is turned on, and the memory cell and array bit line are not connected in a state that the cell bit line connected with the non-selected memory cells and the selection transistor are turned off.

In the above-described NOR type flash memory, the stress due to the bit line may be decreased. However, since the channel width of the selection transistor is the same as the transistor of the memory cell or is smaller than the same, the channel resistance is increased, so that a RC delay problem of the bit line may occur, and the driving capacity of the circuit may be decreased.

In order to overcome the above-described problems, two transistors are integrated, and the bit line and cell bit line are provided at a ratio of 1:2, and then one array bit line is connected with two cell bit lines, respectively. Therefore, in the selection transistor, since the channel width is increased more than two times compared to the channel width of the cell transistor, the channel resistance is decreased, and the RC delay of the bit line is decreased, and the current driving capacity of the transistor is enhanced.

However, in this flash memory, since two cells among the memory cells sharing the word line co-use one array bit line, the memory cells connected with the identical word line are not programmed by one programming operation. Namely, the same are programmed by two programming operations. In addition, since the flash memory has two pages in one word line, a predetermined stress may be present in the word line. Since the sizes of one page and one section are not identical, the above-described memory is not applicable to a solid disk, thus resulting in a predetermined limit in the product specification.

Therefore, the NOR type flash memory capable of overcoming the above-described problems needs a predetermined layout proper for the design rule below a sub-micron.

SUMMARY OF THE INVENTION

Accordingly, it is an object of the present invention to provide a layout of a flash memory and a formation method of the same which overcomes the aforementioned problems encountered in the conventional art.

It is another object of the present invention to provide a layout of a flash memory and a formation method of the same which are capable of significantly decreasing a capacitance between bit lines by increasing the number of channels of the selection transistor, crossingly arranging the electrodes contacting with a source junction region and a drain junction region for thereby forming a cell bit line and an array bit line at a ratio of 1:1 and increasing the space between the cell bit line and array bit line connected in the source junction region and drain junction region.

It is another object of the present invention to provide a layout of a flash memory and a formation method of the same which make it possible to decrease an inter-wire parasitic capacitance by increasing the size of a selection transistor when a leakage current of the cell bit line and array bit line connected with the source junction region and drain junction region of the selection transistor of the flash memory is not large and isolating the cell bit line and array bit line connecting with the source junction region and drain junction region.

It is another object of the present invention to provide a layout of a flash memory and a formation method of the same by which it is possible to enhancing a driving capacity of a transistor by crossingly connecting the contact electrodes contacting with the source junction region and drain junction region of the transistor with respect to one side of the word line.

In order to achieve the above objects, there is provided a layout of a flash memory which includes a plurality of memory cells each having a cell transistor having a cell gate electrode having a floating gate and a control gate, and a source/drain electrode for thereby storing and erasing a data, a selection transistor having two gate electrodes, a common drain electrode between the gate electrodes and a source electrode formed outside the same and having a predetermined channel width larger than two times compared to the channel width of the cell transistor, and the drain electrode and source electrodes which are crossingly formed to each other with respect to the axis of the word lines through which a driving voltage is applied to the gate electrodes for thereby selecting a corresponding memory cell, a pair of cell bit lines connected with the source electrode of the selection transistor and connected in parallel with the drain electrode of the memory cell transistor for inputting/outputting the data to the cell transistor, and a pair of array bit lines connected with a drain electrode of the selection transistor and a peripheral circuit, whereby the selection transistor selecting a first cell transistor among the memory cells is connected with a first cell bit line among a pair of the cell bit lines through the source electrode, and is connected with the second array bit line among a pair of the array bit lines through the drain electrode, and another selection transistor selecting the second cell transistor is connected with the second cell bit line through the source electrode and is connected with the first array bit line through the drain electrode.

In order to achieve the above objects, there is provided a flash memory formation method which includes the steps of forming a cell gate electrode formed by stacking a floating gate and a control gate with a polysilicon insulation film being interposed therebetween in a memory cell region of a semiconductor substrate and a memory cell transistor having a drain and source junction region in which a high density conductive dopant different from the active region is implanted into the active region near the edge of the cell gate electrode and forming a selection transistor having a gate electrode, a drain junction region and a source junction region in the selection transistor region of the substrate, forming a lower interlayer insulation film on a front surface of the substrate on which the transistors are formed, forming the drain and source electrodes contacting with the junction regions in a corresponding drain junction region and source junction region of the memory cell array through the contact hole of the lower interlayer insulation film and crossingly forming the source electrode and drain electrodes in the selection transistor region, forming the cell bit line in such a manner that the source electrode of the selection transistor and the drain electrode of the cell transistor are connected to each other and forming a pad on the upper portion of the drain electrode of the selection transistor, forming an interlayer insulation film on the front surface of the substrate on which the cell bit line and pad are formed, and forming an array bit line connected with the pad exposed through the contact hole in the upper interlayer insulation film.

In order to achieve the above objects, there is provided a layout of a flash memory which includes a plurality of memory cells each having a cell transistor having a cell gate electrode having a floating gate and a control gate, and a source/drain electrode for thereby storing and erasing a data, a selection transistor having two gate electrodes, a common drain electrode between the gate electrodes and a source electrode formed outside the same and having a predetermined channel width larger than two times compared to the channel width of the cell transistor, and the drain electrode and source electrodes which are formed to be symmetrically biased to one of the memory cells with respect to the axis of the word lines through which a driving voltage is applied to the gate electrodes for thereby selecting a corresponding memory cell, a pair of cell bit lines connected with the source electrode of the selection transistor and connected in parallel with the drain electrode of the memory cell transistor for inputting/outputting the data to the cell transistor, and a pair of array bit lines connected with a drain electrode of the selection transistor and a peripheral circuit, whereby the selection transistor selecting a first cell transistor among the memory cells is connected with a first cell bit line among a pair of the cell bit lines through the source electrode, and is connected with the first array bit line among a pair of the array bit lines through the drain electrode, and another selection transistor selecting the second cell transistor is connected with the second cell bit line through the source electrode and is connected with the second array bit line through the drain electrode.

In order to achieve the above objects, there is provided a flash memory formation method which includes the steps of forming a cell gate electrode formed by stacking a floating gate and a control gate with a polysilicon insulation film being interposed therebetween in a memory cell region of a semiconductor substrate and a memory cell transistor having a drain and source junction region in which a high density conductive dopant different from the active region is implanted into the active region near the edge of the cell gate electrode and forming a selection transistor having a gate electrode, a drain junction region and a source junction region in the selection transistor region of the substrate, forming a drain and source electrode contacting with a corresponding drain junction region and source junction region of a memory cell region through a contact hole formed in the lower interlayer insulation film and forming a the source electrode and drain electrode in the selection transistor region, which are symmetrically biased to one of the memory cells, forming an interlayer insulation film on a front surface of the substrate on which the transistors are formed, forming the cell bit line in such a manner that the source electrode of the selection transistor and the drain electrode of the cell transistor are connected to each other and forming a pad on the upper portion of the drain electrode of the selection transistor, forming an interlayer insulation film on the front surface of the substrate on which the cell bit line and pad are formed, and forming an array bit line connected with the pad exposed through the contact hole in the upper interlayer insulation film.

In order to achieve the above objects, there is provided a semiconductor apparatus formation method which includes the steps of forming a gate insulation film on an active region of a semiconductor substrate, forming a gate electrode formed of a multilayer conductive layer on the upper portion of the gate insulation film, forming a drain junction region and source junction region in which a high density conductive dopant which is different from an active region is implanted into the active region near the edge of the gate electrode, forming an interlayer insulation film on the front surface of the substrate in which the drain junction region and source junction region are formed, and forming a drain and source drain so that the drain junction region and source junction region are formed to be crossed to each other through the contact hole of the interlayer insulation film.

In the present invention, the channel width is preferably (the channel width of a cell transistor×2)+(the space between cell transistors).

In the present invention, in the case of the flash memory, the current driving capacity and voltage transfer capacity are significantly increased by increasing the channel width of the selection transistor more than two times compared to the channel width of the cell transistor.

In addition, since the drain electrode and source electrode of a corresponding selection transistor cross each other to be arranged with the drain electrodes of each memory cell connected with a first and second cell bit line, the space between the contact electrodes is increased, and the distance between the array bit line and cell bit line connected with the electrodes is increased.

Since the connection between the drain electrode and source electrode of a corresponding selection transistor is biased to a predetermined cell side for being aligned with the drain electrode of each memory cell connected with a first and second bit line, the cell bit line and array bit line are connected based on a 1:1 connection at a lower/upper wiring portion, so that the capacitance at the array bit line and cell bit line is decreased.

In addition, in the case of the semiconductor apparatus having a known MOS transistor, since the source electrode and drain electrode cross each other, the capacitance between the wiring connected with the source electrode and drain electrode of the transistor is decreased for thereby increasing the current driving and voltage transfer capacities.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims as a result of the experiment compared to the conventional arts.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The embodiments of the present invention will be explained with reference to the accompanying drawings.

Figure 1:
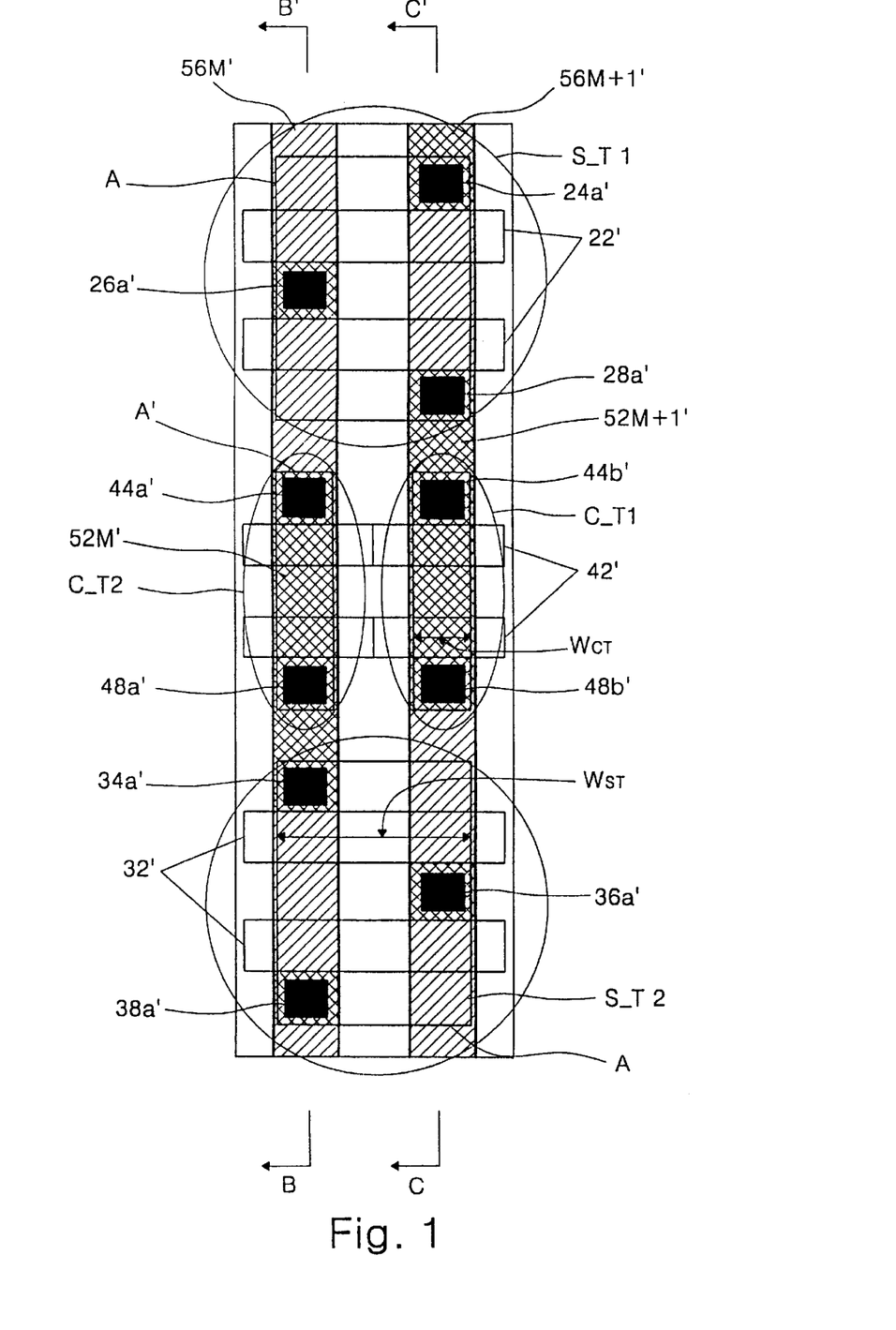
FIG. 1 is a view illustrating a layout of a flash memory according to the present invention.

FIG. 1 illustrates the layout of a flash memory according to the present invention. This embodiment is directed to a NOR type flash memory. In this case, there are provided two cell transistors.

The NOR type flash memory includes a first selection transistor S_T1 and a second selection transistor S_T2 for selecting a corresponding cell, a first memory cell C_T1 having a cell transistor connected with the first selection transistor S_T21 and having its parallely connected drain and its commonly connected source, and a second memory cell C_T2 connected with the second selection transistor S_T2 and having its parallely connected drain and its commonly connected source. The channel widths of the first selection transistor S_T1 and second selection transistor S_T2 are larger than the bit line pitch between two memory cells. In more detail, the widths of the same are larger more than two times compared to the channel width of the cell transistor, the driving capacity of the transistor is increased.

Referring to FIG. 1, in the first selection transistor S_T1 and second selection transistor S_T2, there are provided an active mask A defining an active region, a gate mask 22' forming a gate electrode of a cell transistor, and contact masks 24a', 26a' and 28a', 34a', 36a', and 38a' forming the contact electrodes of the drain and source junction region of the cell transistor. In the drawings, WST represents the width of the channel region of the selection transistor.

In addition, in the first memory cell C_T1 and second memory cell C_T2, there are provided an active mask A' defining an active region, a gate mask 32' forming a gate electrode of the cell transistor, and contact masks 44a', 48a', 44b' and 48b' forming the drain electrode of the cell transistor. In the drawing, $W_{ST}$ represents the width of the channel region of the cell transistor. Here, the contact mask forming the source electrode of the cell transistor is not shown. 52M' and 52M+1' represent wiring mask connecting in parallel the drain junction regions of the cell transistor and forming a cell bit line connected with the source of the selection transistor, and 56M' and 56M+1' represent a wiring mask connected with the common drain junction region of the selection transistor and forming an array bit line connecting the selection transistor with the peripheral circuits such as a page buffer, a decoder, etc.

Here, assuming that the group of the memory cells using the common bit line among a plurality of memory cells is a string, M represents an even number of memory cell strings, and M+1 represents an odd number of memory cell strings.

Figure 2:
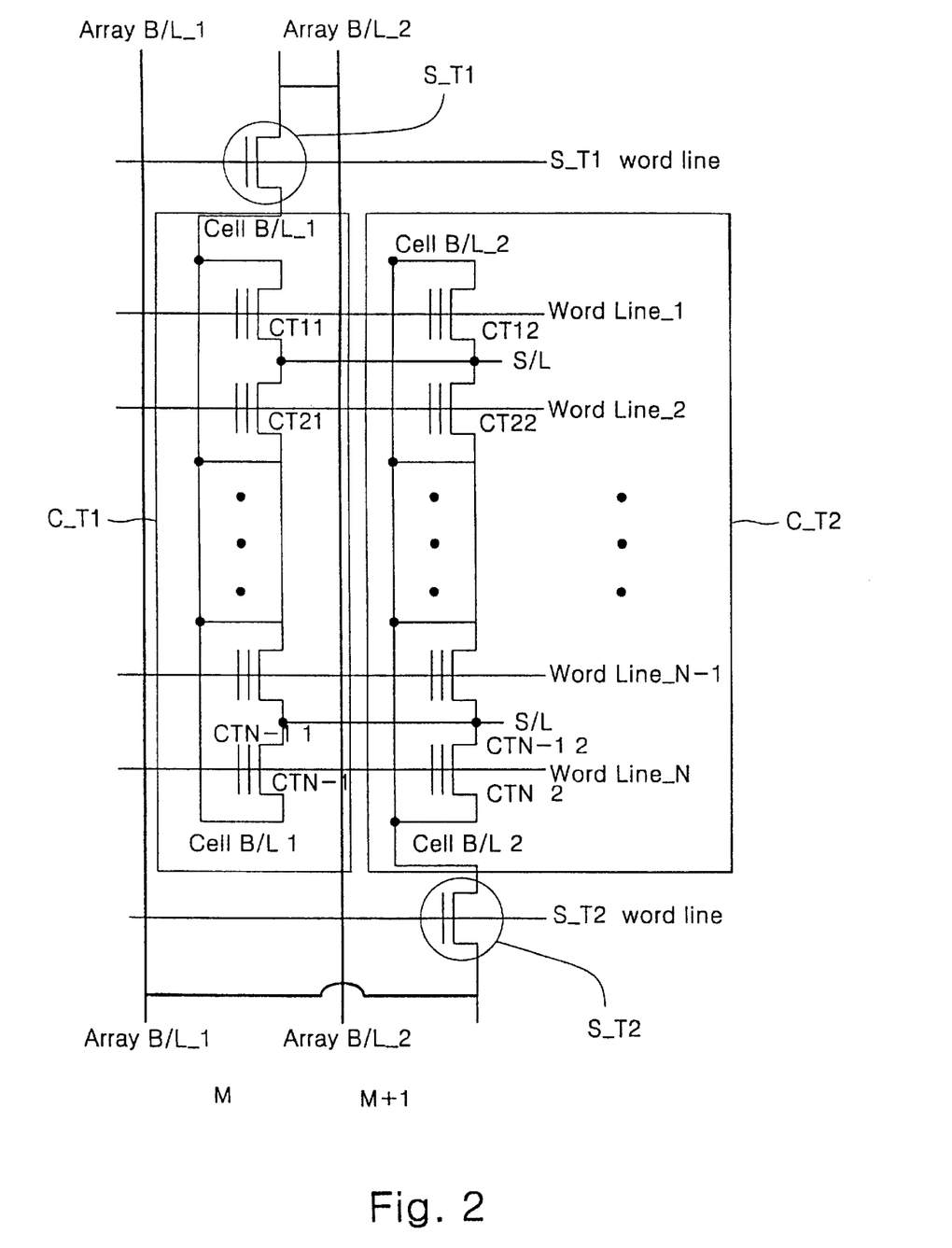
FIG. 2 is a view illustrating a circuit diagram illustrating the structure of a flash memory according to the present invention.

FIG. 2 illustrates the structure of a flash memory according to the present invention. As shown therein, the NOR type flash memory includes a first memory cell string 2 and a second memory cell string 4 in which a plurality of cell transistors $CT_{11}, \ldots, CT_{N1}$ and $CT_{12}, \ldots, CT_{N2}$ each having its gate electrode having a floating gate and a control gate, drain and source electrode and storing and erasing the data and the sources are commonly connected, and the drains are connected in parallel, cell bit lines Cell B/L_1 and Cell B/L_2 connecting the drains of the cell transistors $CT_{11}, \ldots, CT_{N1}$ and $CT_{12}, \ldots CT_{N2}$ forming the memory cell strings 2 and 4 in parallel, word lines Word Line_1, ..., Word Line_N parallely connecting the gate electrodes of the cell transistors $CT_{11}, \ldots, CT_{N1}$ and $CT_{12}, \ldots, CT_{N2}$ in the direction of the row, and a common source S/L commonly connecting the source electrodes of the cell transistors $CT_{11}, \ldots, CT_{N1}$ and $CT_{12}, \ldots, CT_{N2}$ for thereby erasing a reference and data.

In addition, the NOR type flash memory includes a first selection transistor S_T1 and a second selection transistor S_T2 each having its gate, drain and source and being switched to activate the cell bit lines Cell B/L_1 and Cell B/L_2 of the first memory cell string 2 and the second memory cell string 4, first and second array bit lines Array B/L_1 and Array B/L_2 connected with a peripheral circuit such as a bit line decoder, page buffer, etc. parallely connecting the selection transistors S_T1 and S_T2 in the row connection, and word lines S_T1 word line and S_T2 applying a driving voltage to the gates of the selection transistors S_T1 and S_T2.

At this time, the first selection transistor S_T1 and the second selection transistor S_T2 have their drain electrodes connected with the second array bit line Array B/L_2 and the first array bit line Array B/L_1, respectively, and their source electrodes connected with the bit lines Cell B/L_1 and Cell B/L_2 of the first and second memory cell strings 2 and 4.

Figure 3:
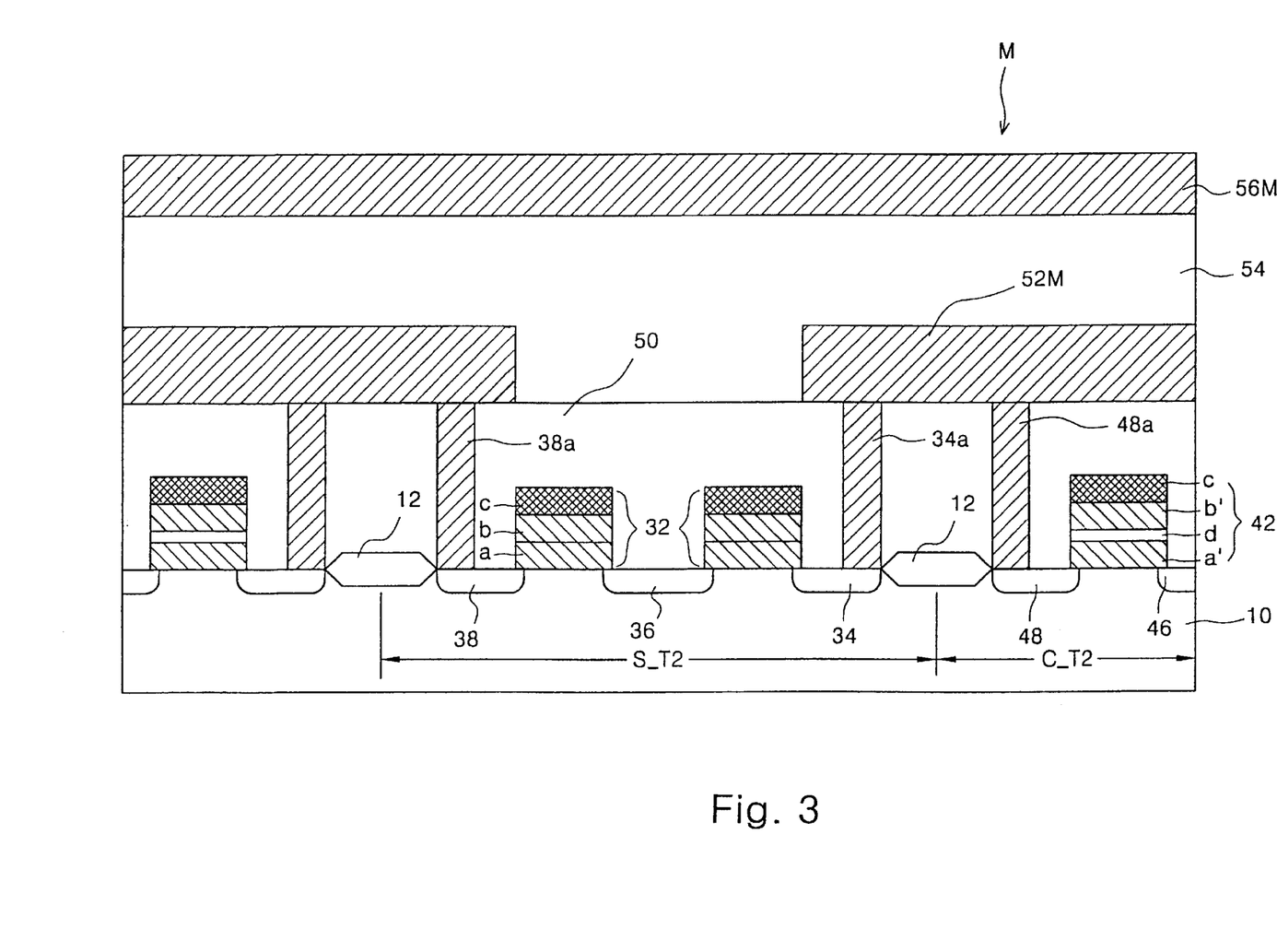
FIG. 3 is a vertical cross-sectional view illustrating a memory based on a (M) selection transistor in the layout of FIG. 1.
Figure 4:
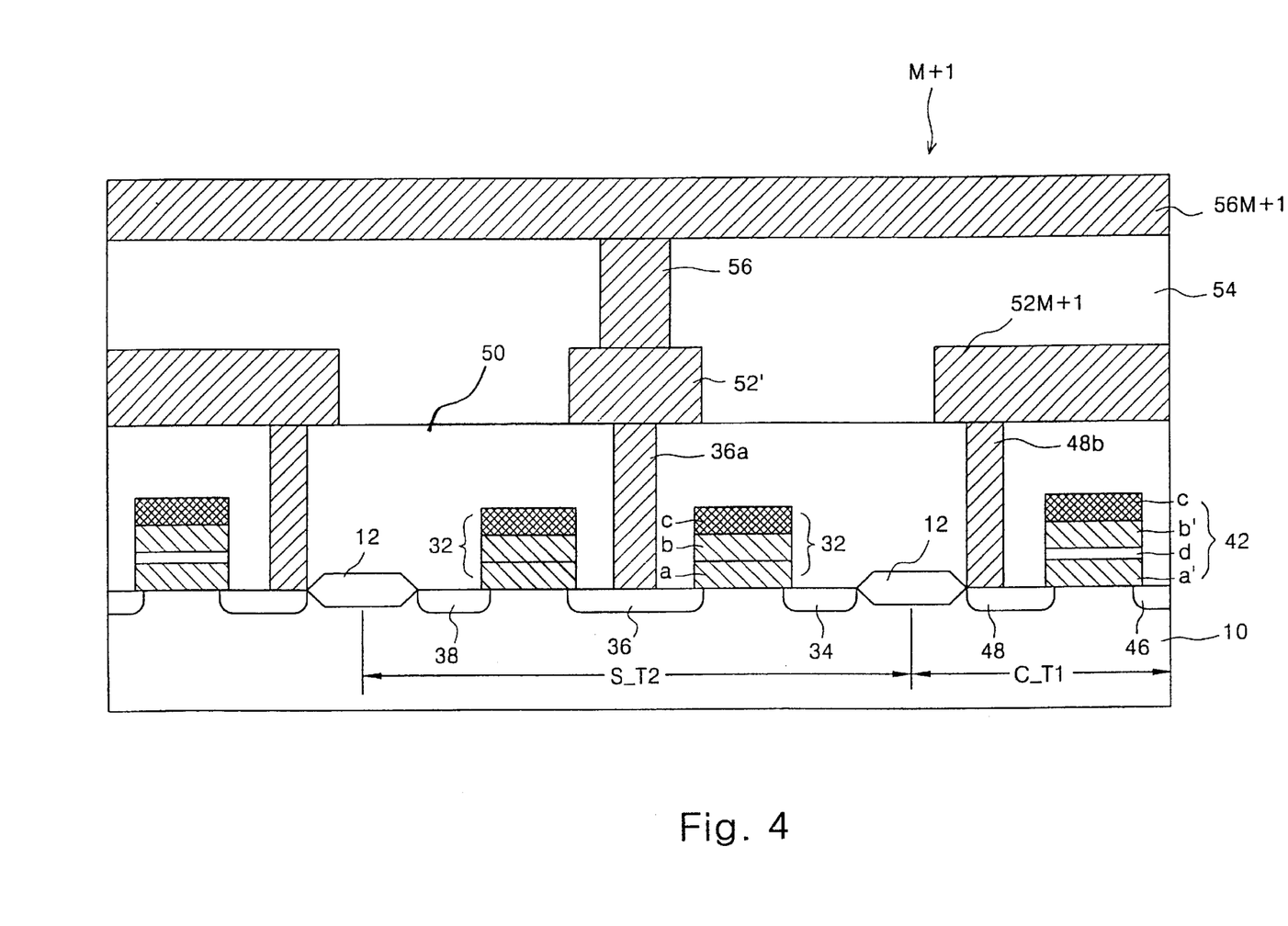
FIG. 4 is a vertical cross-sectional view illustrating a memory based on a (M+1) selection transistor in the layout of FIG. 1.

FIG. 3 illustrates a memory based on a (M) selection transistor in the layout of FIG. 1, and FIG. 4 illustrates a memory based on a (M+1) selection transistor in the layout of FIG. 1. The selection transistor shown in FIGS. 3 and 4 is a second selection transistor. Here, the first selection transistor is not shown for simplicity.

As shown in FIGS. 3 and 4, the NOR type flash memory includes selection transistors each formed of a device isolation region 12 formed on a silicon substrate 10 for isolating a memory cell region and a selection transistor region, a gate electrode 32 formed of two-tier gate conductive layers a and b sequentially stacked on the upper surface of the active region of the substrate 10 corresponding to the results of the first selection transistor(not shown) and the second selection transistor S_T2, and drain and source junction regions 34, 36 and 38 formed on the active region near the lower portions of the gate electrode 32. Here, the gate electrode 32 is formed by stacking the silicide layer c on the upper surface of the control gate conductive layer b.

In addition, the NOR type flash memory includes cell transistors each formed of a gate electrode 42 having a floating gate conductive layer a', a gate insulation film d, and a control gate conductive layer b' which are sequentially stacked on the upper portion of the active region of the substrate 10 corresponding to the regions of the first memory cell C_T1 and the second memory cell C_T2, and drain and source junction regions 46 and 48 formed on the active region near the gate electrode 42. Here, the gate electrode 42 is formed by stacking the silicide layer c on the upper surface of the control gate conductive layer b'.

In the flash memory, the source junction region 34 of the second selection transistor S_T2 and the drain junction region 48 of the second memory cell C_T2 are connected with the second cell bit line 52M through the source electrode 34a and the drain electrode 48a, respectively, and the drain junction region 36 of the second selection transistor S_T2 is connected with the first array bit line 56M+1 through a pad 52' formed in the upper layer insulation film 54 insulating the front surface of the structure in which the first cell bit line 52M+1 and the second cell bit line 52M are formed. In addition, the drain junction region 48 of the first memory cell C_T1 is connected with the first cell bit line 52M+1 through the drain electrode 48b of the cell transistor.

The second array bit line 56M is isolated from the second cell bit line 52M by the upper layer insulation film 54.

Namely, the first and second cell bit lines 52M+1 and 52M are formed on the upper surface of the lower layer insulation film 50 and are connected with the junction region of the substrate 10 corresponding to the memory cell and selection transistor regions. The first and second array bit lines 56M+1 and 56M are formed on the upper surface of the upper layer insulation film 54 and are connected with the drain junction region of the selection transistor.

As shown in FIG. 3, the second selection transistor S_ is connected with the second cell bit line 52M parallely connecting the cell transistor drain of the second memory cell C_T2 to the source junction regions 34 and 38. In addition, as shown in FIG. 4, the second selection transistor S_T2 is connected with the first array bit line 56M+1 connecting a peripheral circuit such as a bit line decoder, a page buffer, etc. to the drain junction region 36.

Therefore, in the selection transistor for selecting the memory cell, the drain electrode and source electrode are crossingly connected about the axis of the word line through which a driving voltage is applied to the gate electrode, so that the odd number of the array bit lines are electrically connected with the even number of the cell bit lines, and the even number of the array bit lines are electrically connected with the odd number of the cell bit lines.

The formation method according to the present invention will be explained with reference to FIGS. 3 and 4.

First, the device isolation process is performed using an active mask for thereby forming a device isolation film 12 defining an active region of a memory cell and selection transistor on the silicon substrate 10. At this time, the selection transistor region has an active region width corresponding to the combined size of two bit line distances.

Namely, this width is (the width of the memory cell×2)+(the space between the memory cells). Generally, the width of the selection transistor according to the present invention is increased about three times compared to the width of the known selection transistor.

The floating gate conductive layer a' and the control gate conductive layer b' are stacked on the active region corresponding to the memory cell region of the substrate 10, on which the device isolation film 12 is formed, and the polysilicon insulation film d is formed therebetween. the gate electrode 42 on which the silicide layer c is stacked is formed on the resultant structure, and a cell transistor having its drain and source junction regions 48 and 46, into which a high density conductive dopant is implanted differently from the active region, is formed in the active region near the edge of the gate electrode 42.

The gate electrode 32 on which the two-tier conductive layers a and b, and the silicide layer c are sequentially stacked is formed on the active region corresponding to the selection transistor of the substrate, and drain junction region 36 and the source junction regions 34 and 38 into which a high density conductive dopant is implanted differently from the active region are formed in the active region near the edge of the gate electrode 32. Here, in the selection transistor, since two transistors are integrated for decreasing the active region space, two gate electrodes co-use the drain junction region 36.

The interlayer insulation film 50 is formed on the front surface of the substrate 10 for thereby forming a contact hole through which the junction region of the transistor is opened using the contact mask. In particular, the contact holes exposing the drain junction region 36 and the source junction regions 34 and 38 of the selection transistor are not formed by symmetrically aligning the same with respect to the word line, but formed symmetrically by forming a predetermined space as much as the distance of the bit line based on the axis of the word line by the width of the gate for the axis of the bit line.

Thereafter, the metal wiring process is performed. The drain electrode 48a and the source electrode(not shown) contacting with the cell transistor drain junction region 48 and the source junction region(not shown) through the contact hole in the interlayer insulation film 50 are formed, and the source electrodes 34a and 38a contacting with the source junction regions 34 and 38 of the selection transistor, and the drain electrode 48a contacting with the drain junction region 36 are formed, respectively.

The metal wire process is performed for the upper surface of the interlayer insulation film 50, and the junction pad 52' is formed for connecting the drain electrode 36a of the selection transistor to a corresponding array bit line which will be formed later. The second bit line 52M connecting the drain electrode 48a of the second memory cell C_T2 and the source electrode 34a of the second selection transistor S_T2, and the first cell bit line 52M+1 connecting the drain electrode 48b of the first memory cell C_T1 and the source electrode of the first selection transistor(not shown) are formed, respectively.

Next, an interlayer insulation film 54 is formed on the front surface of the substrate on which the first and second cell bit lines 52M+1 and 52M are formed. In addition, the contact hole formation process and wiring process are sequentially performed for the interlayer insulation film 54. The first array bit line 56M+1 is formed through the contact electrode connecting the drain electrode 36a of the second selection transistor S_T2 and the junction pad 52' and the vertical contact electrode connecting the second array bit line 56M and the drain electrode of the first selection transistor(not shown).

Therefore, in the present invention, since the source and drain electrodes contacting with the source and drain junction regions of the selection transistor are formed with a bit line distance about the axis of each word line and are crossingly formed based on a predetermined distance as long as the width of the gate abut the axis of the bit line, the odd number of the array bit lines are electrically connected with the even number of the cell bit lines, and the even number of the array bit lines are electrically connected with the odd number of the cell bit lines.

Figure 5:
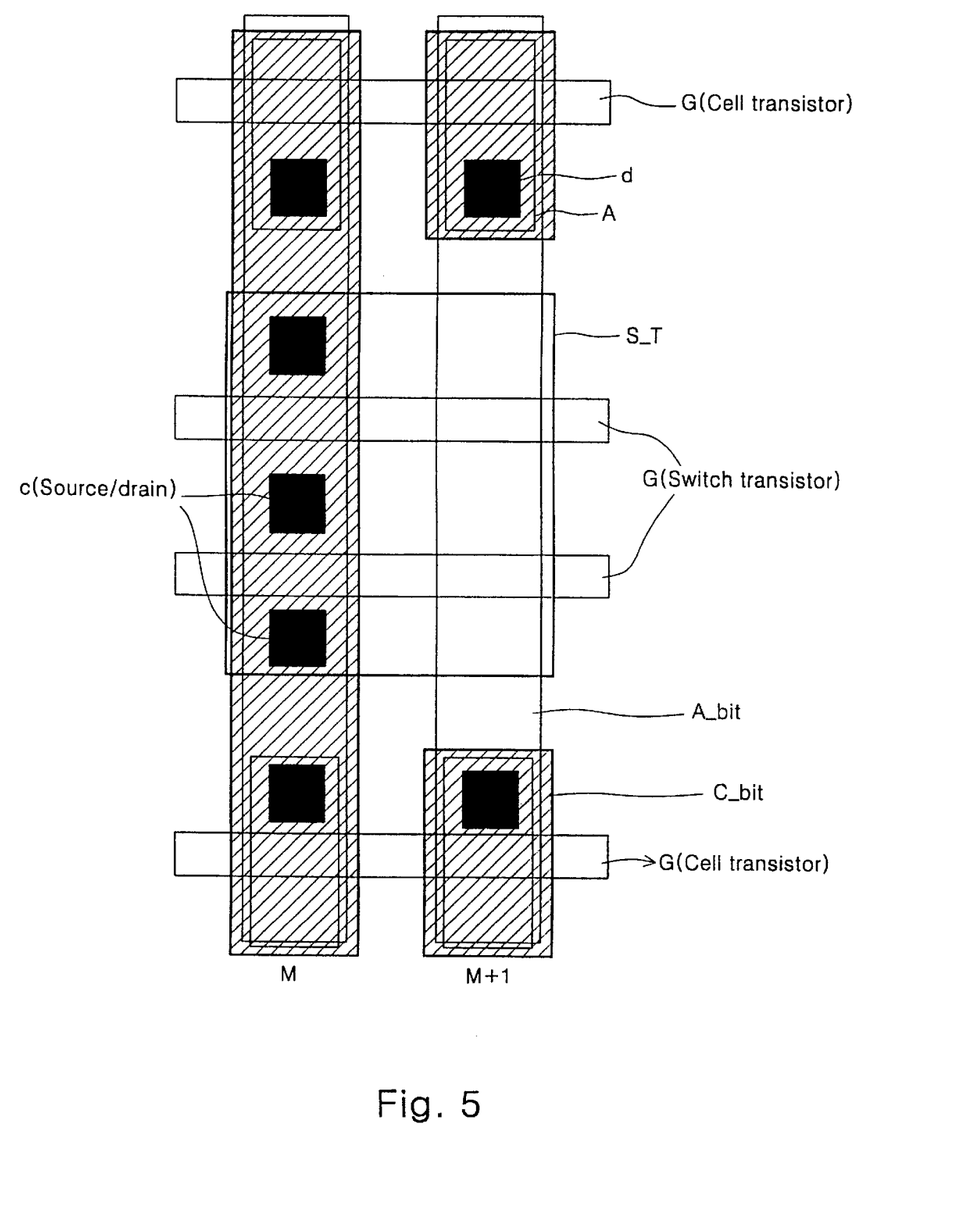
FIG. 5 is a view illustrating a layout of a flash memory according to the present invention.

FIG. 5 illustrates the layout of the flash memory according to the present invention.

In the drawing, A represents an active region, S_T represents a selection transistor region, G represents the gate masks of the selection transistor and cell transistor, c represents the contact mask of the selection transistor, and d represents the contact mask of the cell transistor. In addition, A_bit represents an array bit line region, and C_bit represents a cell bit line region.

In the flash memory according to the present invention, assuming that the space between the source and drain electrodes of the selection transistor does not affect the leakage current of the device, the width of the channel of the selection transistor is larger more than two times compared to the channel width of the cell transistor.

In selection memory according to the present invention, the drain and source electrodes are aligned for the drain electrode of a corresponding memory cell among the memory cells connected with the first and second cell bit lines and are symmetrical about the axis of the word line.

Therefore, in the above-described flash memory, the selection transistors selecting the first cell transistor are electrically connected with the first cell bit line through the source electrode and are electrically connected with the first array bit line through the drain electrode, respectively. In addition, the selection transistor selecting the second cell transistor is electrically connected with the second cell bit line through the source electrode and is electrically connected with the second array bit line through the drain electrode. At this time, the cell bit line and array bit line are formed in different wiring structure in which the heights of the same are different due to the different wiring processes.

As described above, in the present invention, since the channel width of the selection transistor is larger than the channel width of the memory cell transistor without changing the size of the flash memory in which the array bit line and cell bit line are formed at a ratio of 1:1, the current driving capacity and voltage transfer capacity of the selection transistor are increased.

In the selection transistor of the present invention, since the source electrode and drain electrode are formed crossingly about the axis of the bit line by the distance therebetween as long as the width of the gate or are symmetrically formed in one memory cell with respect to the axis of the word line for thereby improving the RC delay of the bit line. Therefore, the data are inputted/outputted through the cell bit line connected with the cell array by turning on/off the selection transistor. The cell bit line is electrically isolated from the array bit line connected with the turned-on selection transistor, so that the junction capacitance occurring in the cell transistor of the selected cell array is decreased for thereby preventing a drain disturbing phenomenon.

In addition, since the array line and cell bit line may be electrically connected through the selection transistor separately connected with the memory cell array co-using the word line, it is possible to implement one page and one sector using one word line, so that the present invention is applicable to the solid disk.

In the flash memory according to the present invention, it is possible to minimize the leakage current occurring in the memory cell connected with the non-selected cell bit line in the read mode for thus decreasing the entire capacitances of the bit lines.

The present invention is not limited to the above-described embodiments. For example, in the case of the semiconductor apparatus having a MOS transistor, the source and drain electrodes may be crossingly formed thus implementing the same purposes.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A layout of a flash memory, comprising:

a plurality of memory cells each having a cell transistor having a cell gate electrode having a floating gate and a control gate, and a source/drain electrode for thereby storing and erasing a data;

a selection transistor having two gate electrodes, a common drain electrode between the gate electrodes and a source electrode formed outside the same and having a predetermined channel width larger than two times compared to the channel width of the cell transistor, and the drain electrode and source electrodes which are crossingly formed to each other with respect to the axis of the word lines through which a driving voltage is applied to the gate electrodes for thereby selecting a corresponding memory cell;

a pair of cell bit lines connected with the source electrode of the selection transistor and connected in parallel with the drain electrode of the memory cell transistor for inputting/outputting the data to the cell transistor; and a pair of array bit lines connected with a drain electrode of the selection transistor and a peripheral circuit, whereby the selection transistor selecting a first cell transistor among the memory cells is connected with a first cell bit line among a pair of the cell bit lines through the source electrode, and is connected with the second array bit line among a pair of the array bit lines through the drain electrode, and another selection transistor selecting the second cell transistor is connected with the second cell bit line through the source electrode and is connected with the first array bit line through the drain electrode.

2. The layout of claim 1, wherein said channel width is (the channel width of the cell transistor×2)+(the space between the cell transistors).

3. A flash memory formation method, comprising the steps of:

forming a cell gate electrode formed by stacking a floating gate and a control gate with a polysilicon insulation film being interposed therebetween in a memory cell region of a semiconductor substrate and a memory cell transistor having a drain and source junction region in which a high density conductive dopant different from the active region is implanted into the active region near the edge of the cell gate electrode and forming a selection transistor having a gate electrode, a drain junction region and a source junction region in the selection transistor region of the substrate;

forming a lower interlayer insulation film on a front surface of the substrate on which the transistors are formed;

forming the drain and source electrodes contacting with the junction regions in a corresponding drain junction region and source junction region of a memory cell array through the contact hole of the lower interlayer insulation film and crossingly forming the source electrode and drain electrodes in the selection transistor region;

forming the cell bit line in such a manner that the source electrode of the selection transistor and the drain electrode of the cell transistor are connected to each other and forming a pad on the upper portion of the drain electrode of the selection transistor;

forming an interlayer insulation film on the front surface of the substrate on which the cell bit line and pad are formed; and forming an array bit line connected with the pad exposed through the contact hole in the upper interlayer insulation film.

4. The method of claim 3, further comprising a step for depositing a silicide layer on the upper surfaces of the cell gate electrode of the cell transistor and the gate electrode of the selection transistor.

5. A layout of a flash memory, comprising:

a plurality of memory cells each having a cell transistor having a cell gate electrode having a floating gate and a control gate, and a source/drain electrode for thereby storing and erasing a data;

a selection transistor having two gate electrodes, a common drain electrode between the gate electrodes and a source electrode formed outside the same and having a predetermined channel width larger than two times compared to the channel width of the cell transistor, and the drain electrode and source electrodes which are formed to be symmetrically biased to one of the memory cells with respect to the axis of the word lines through which a driving voltage is applied to the gate electrodes for thereby selecting a corresponding memory cell;

a pair of cell bit lines connected with the source electrode of the selection transistor and connected in parallel with the drain electrode of the memory cell transistor for inputting/outputting the data to the cell transistor; and a pair of array bit lines connected with a drain electrode of the selection transistor and a peripheral circuit, whereby the selection transistor selecting a first cell transistor among the memory cells is connected with a first cell bit line among a pair of the cell bit lines through the source electrode, and is connected with the first array bit line among a pair of the array bit lines through the drain electrode, and another selection transistor selecting the second cell transistor is connected with the second cell bit line through the source electrode and is connected with the second array bit line through the drain electrode.

6. The layout of claim 1, wherein said channel width is (the channel width of the cell transistor×2)+(the space between the cell transistors).

7. A flash memory formation method, comprising the steps of:

forming a cell gate electrode formed by stacking a floating gate and a control gate with a polysilicon insulation film being interposed therebetween in a memory cell region of a semiconductor substrate and a memory cell transistor having a drain and source junction region in which a high density conductive dopant different from the active region is implanted into the active region near the edge of the cell gate electrode and forming a selection transistor having a gate electrode, a drain junction region and a source junction region in the selection transistor region of the substrate;

forming a drain and source electrode contacting with a corresponding drain junction region and source junction region of a memory cell region through a contact hole formed in the lower interlayer insulation film and forming the source electrode and drain electrode in the selection transistor region, which are symmetrically biased to one of the memory cells;

forming an interlayer insulation film on a front surface of the substrate on which the transistors are formed;

forming the cell bit line in such a manner that the source electrode of the selection transistor and the drain electrode of the cell transistor are connected to each other and forming a pad on the upper portion of the drain electrode of the selection transistor;

forming an interlayer insulation film on the front surface of the substrate on which the cell bit line and pad are formed; and forming an array bit line connected with the pad exposed through the contact hole in the upper interlayer insulation film.

8. The method of claim 7, further comprising a step for depositing a silicide layer on the upper surfaces of the cell gate electrode of the cell transistor and the gate electrode of the selection transistor.

9. The semiconductor apparatus formation method, comprising:

forming a gate insulation film on an active region of a semiconductor substrate;

forming a gate electrode formed of a multilayer conductive layer on the upper portion of the gate insulation film;

forming a drain junction region and source junction region in which a high density conductive dopant which is different from an active region is implanted into the active region near the edge of the gate electrode;

forming an interlayer insulation film on the front surface of the substrate in which the drain junction region and source junction region are formed; and forming a drain and source drain so that the drain junction region and source junction region are formed to be crossed to each other through the contact hole of a interlayer insulation film.

10. The method of 9, further comprising a step for depositing a silicide layer on an upper surface of the gate electrode.

* * * * *